(12) United States Patent
Wei et al.

(10) Patent No.: US 10,447,434 B2
(45) Date of Patent: Oct. 15, 2019

(54) METHOD AND APPARATUS OF PROCESSING A DIGITALLY ENCODED RADIO SIGNAL

(71) Applicant: Nordic Semiconductor ASA, Trondheim (NO)

(72) Inventors: Li Wei, Trondheim (NO); Eivind Sjøgren Olsen, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 15/782,022

(22) PCT Filed: Oct. 31, 2016

(86) PCT No.: PCT/GB2016/053380
§ 371 (c)(1),
(2) Date: Jun. 6, 2018

(87) PCT Pub. No.: WO2017/098196
PCT Pub. Date: Jun. 15, 2017

(65) Prior Publication Data
US 2018/0359052 A1    Dec. 13, 2018

(30) Foreign Application Priority Data

Dec. 11, 2015 (GB) .................................. 1521875.3

(51) Int. Cl.
*H04L 1/00* (2006.01)
*H04L 25/03* (2006.01)
*H03M 13/41* (2006.01)
(52) U.S. Cl.
CPC ...... *H04L 1/0054* (2013.01); *H03M 13/4138* (2013.01); *H04L 25/03318* (2013.01)

(58) Field of Classification Search
CPC ........................... H04L 1/0054; H04L 1/0052; H04L 25/067; H04B 7/0413
See application file for complete search history.

(56) References Cited

U.S. PATENT DOCUMENTS 4,573,155 A    2/1986  Currie et al.
6,205,428 B1 *  3/2001  Brown .................... G10L 17/14
                                                            455/563

(Continued)

FOREIGN PATENT DOCUMENTS

GB          2512935 A        10/2014
WO     WO 02/31983 A2         4/2002

OTHER PUBLICATIONS

International Search Report and Written Opinion for PCT/GB2016/053380, dated Dec. 21, 2016, 12 pages.

(Continued)

*Primary Examiner* — Shuwang Liu
*Assistant Examiner* — Gina M McKie
(74) *Attorney, Agent, or Firm* — Klarquist Sparkman, LLP

(57) ABSTRACT

A method of processing a digitally encoded radio signal (102) comprising a bit to be determined is disclosed. The method comprises correlating a first bit sequence (103) comprising the bit with a plurality of predetermined filters (104*a-h*) to create a first set of filter coefficients (110*a-h*); calculating (120) a first likelihood data set (124) comprising a likelihood of said bit having a given value for each bit position from the first set of filter coefficients. A second bit sequence (103) comprising the bit at a different position is then correlated with the filters to create a second set of filter coefficients (10*a-h*), from which a second likelihood data set (124) is calculated. A soft output bit (26) comprising a probability weighted bit value from data corresponding to (Continued)

the bit at a first and second bit positions from the first and second likelihood data sets respectively is then calculated.

18 Claims, 4 Drawing Sheets

(56) References Cited

U.S. PATENT DOCUMENTS

| | | | | |
|---|---|---|---|---|
| 6,671,667 B1* | 12/2003 | Chandran | ............... | G10L 25/78 |
| | | | | 704/226 |
| 2010/0061490 A1 | 3/2010 | Noeldner | | |
| 2011/0158257 A1* | 6/2011 | Kwon | ................... | H04L 1/0086 |
| | | | | 370/474 |
| 2018/0061398 A1* | 3/2018 | Gomez | ................. | G10L 15/063 |

OTHER PUBLICATIONS

Osborne et al., "Coherent and Noncoherent Detection of CPFSK," Southern Illinois University Carbondale, OpenSIUC, Department of Electrical and Computer Engineering, Aug. 1974, 15 pages.

Search Report under Section 17(5) for GB1521875.3, dated Jul. 25, 2016, 3 pages.

* cited by examiner

METHOD AND APPARATUS OF PROCESSING A DIGITALLY ENCODED RADIO SIGNAL

CROSS REFERENCE TO RELATED APPLICATIONS

This is the U.S. National Stage of International Application No. PCT/GB2016/053380, filed Oct. 31, 2016, which was published in English under PCT Article 21(2), which in turn claims the benefit of Great Britain Application No. 1521875.3, filed Dec. 11, 2015.

The present invention relates to signal processors, particularly those that feature a matched filter bank that is used to decode received bitstreams.

Received digital signals used in communications typically comprise a carrier wave that is modulated in some manner so as to impart the carrier wave with data, the data itself being a bitstream of digital "0"s and "1"s. There are a number of different modulation schemes that could be used. Digital radio signals can often be subject to noise and glitches that may cause uncertainty regarding whether a received bit was a digital "0" or "1". It is important to correctly determine the bit value in order for the data contained within the received signal to be useful.

One approach to solving this problem is to simply perform a thresholding operation on each received bit, assigning each one a definitive 0 or 1 value depending on which it is closer to. Another solution, outlined in WO2014/167318 (incorporated herein by reference), is to take multiple observations of a particular received bit, determine whether the received bit is a 0 or 1 for each observation and then subsequently decide that the bit has the value (i.e. 0 or 1) observed the majority of the time.

The approaches outlined above make a "hard", i.e. definitive decision regarding the value that should be assigned to a particular based on instantaneous observations. Hard decisions therefore "throw away" information earlier than may be necessary. Take an exemplary decoder arranged to make hard decisions on whether a received bit is a 0 or a 1 based on a received voltage level associated with the bit, wherein a voltage level between 0 V and 0.5 V corresponds to a digital 0 and a voltage level between 0.5 V and 1 V corresponds to a digital 1. Two distinct bits with voltage levels of 0.501 V and 0.999 V respectively will both be determined to have a digital value of 1, yet the latter is vastly more likely to be correct than the former. However, once the decision has been made, this information corresponding to uncertainty is lost.

Instead of simply making hard decisions regarding the bits within a given bitstream, it is known in the art per se to provide the bitstream as an input to a 'soft' decoder such as a "Viterbi decoder". A Viterbi decoder implements a "Viterbi Algorithm" (named after its creator Andrew J. Viterbi) that makes use of uncertainty information and is well documented per se throughout many engineering fields. The Viterbi algorithm finds particular use in decoding the convolutional codes that are used in both code division multiple access (CDMA) and Global System for Mobile Communications (GSM) digital cellular communications, dial-up modems, satellite and deep-space communications, and 802.11 wireless local area networks (WLANs). However, a Viterbi decoder requires uncertainty information regarding each received bit, as it typically utilises the probability associated with each possible state that a variable may have as well as the probability of transitions between states.

Typically, the inputs to a Viterbi decoder are generated by first processing the bitstream using a frequency discriminator to determine a likelihood value from the number of times a 0 or a 1 is observed. However frequency discriminators require an estimate of the phase of the incoming signal and are not particularly sensitive.

The present invention provides an alternative approach with a view to increasing receiver sensitivity.

When viewed from a first aspect, the present invention provides a method of processing a digitally encoded radio signal comprising a bit to be determined, the method comprising:
  correlating a first bit sequence comprising the bit with a plurality of predetermined filters to create a first set of filter coefficients;
  calculating a first likelihood data set comprising a likelihood of said bit having a given value for each bit position from the first set of filter coefficients; correlating a second bit sequence comprising the bit with the plurality of predetermined filters to create a second set of filter coefficients;
  calculating a second likelihood data set comprising a likelihood of said bit having a given value for each bit position from the second set of filter coefficients; and
  calculating a soft output bit comprising a probability weighted bit value from data corresponding to the bit at a first bit position from the first likelihood data set and the bit at a second bit position from the second likelihood data set, wherein said first and second bit positions are different.

When viewed from a second aspect, the present invention provides an apparatus arranged to process a digitally encoded radio signal comprising a bit to be determined, said apparatus being arranged to:
  correlate a first bit sequence comprising the bit with a plurality of predetermined filters to create a first set of filter coefficients;
  calculate a first likelihood data set comprising a likelihood of said bit having a given value for each bit position from the first set of filter coefficients;
  correlate a second bit sequence comprising the bit with the plurality of predetermined filters to create a second set of filter coefficients;
  calculate a second likelihood data set comprising a likelihood of said bit having a given value for each bit position from the second set of filter coefficients; and
  calculate a soft output bit comprising a probability weighted bit value from data corresponding to the bit at a first bit position from the first likelihood data set and the bit at a second bit position from the second likelihood data set, wherein said first and second bit positions are different.

Thus it will be seen by those skilled in the art that in accordance with the invention multiple observations of a particular bit are made at different times, and information regarding uncertainty in each observation is retained for use in determining bit values from latter observations. This can lead to improved receiver sensitivity. For example in accordance with some embodiments of the invention, improvements of around 0.3 dB can be achieved.

The Applicant has appreciated that embodiments of the method of the present invention allows a matched filter bank (MFB) to produce a soft output that is suitable for use with such Viterbi decoders, though of course the applications of the invention are not limited to this. In a set of embodiments however a decoder, e.g. a Viterbi decoder, is to determine a value for the bit using the soft output bit. It will be appreciated that the present invention can be implemented with any number of observations by correlating further subsequent bit sequences and calculating corresponding further likelihood data sets, from which data corresponding to further bit positions can be factored into the soft output bit calculation. In some embodiments, the method further comprises:

correlating an additional bit sequence comprising the bit with the plurality of predetermined filters to create an additional set of filter coefficients;

calculating an additional likelihood data set comprising a likelihood of said bit having a given value for each bit position from the additional set of filter coefficients; and calculating the soft output bit from data corresponding to the bit at the first bit position from the first likelihood data set, the bit at the second bit position from the second likelihood data set, and the bit at an additional bit position from the additional likelihood data set wherein each of said bit positions is different.

The apparatus of the invention may be correspondingly arranged.

The invention may be implemented with bit sequences of any length but preferably more than one and thus, at least in some embodiments, said bit sequences comprise a plurality of bits. In preferred embodiments, correlations with each of the predetermined filters are carried out for bit sequences corresponding to a given bit being at each possible position in the sequences so that observations of the bit in question are made at every position in the bit sequence which maximises the observations made. In general, storing more observations of each bit will require additional memory, but will improve the confidence associated with the end result and provide additional uncertainty information that may later be relied upon e.g. by a Viterbi decoder.

Each observation of a given bit happens at a different point in time. Conveniently, the subsequent bit sequence is generated by shifting the initial bit sequence. By storing the received signal input in a shift register, bitwise shifts can be made to propagate the bits with each observation and thus the soft output bit is calculated using multiple observations of a particular bit as it propagates through the shift register.

There are a number of metrics that could be used in order to calculate the value of the soft output bit. The decision regarding the particular metric to use will often rely on circuit design considerations, balancing complexity, chip area, speed and the bill of materials. In some embodiments, the soft output bit is calculated by summing data corresponding to said first, second and optionally additional, bit positions. This corresponds to deciding on balance, given all observations of a particular bit, whether the bit was more likely to have been a 0 or 1 and incorporates multiple observations associated with a given bit e.g. either all of or a subset of all observations made for a given bit. In a subset of such embodiments, the soft output bit is calculated by performing a weighted sum of data corresponding to said bit positions. In such embodiments, the various observations may be given different weights such that, by way of example only, older observations could be weighted less than more recent observations.

In some other embodiments, the soft output bit is calculated by taking a maximum of data corresponding to said first, second and optionally additional, bit positions. In such embodiments, the soft bit is then based only on the most confident observation made i.e. for all the observations made, the soft output bit is assigned the value and associated uncertainty information corresponding to the observation in which it was most certain that the bit was either 0 or 1.

While it may—at least in some cases—be sufficient to check only for certain bit sequences within the set of $2^N$ possible sequences for a sequence length N, in preferred embodiments the predetermined filters comprise each possible bit sequence. If, for example, two observations are being made for each bit within the input signal—there are four possible bit sequences that could be received: 00, 01, 10, and 11.

The maximum likelihood data sets could be discarded once the soft output bit has been determined, but in some embodiments the maximum likelihood data sets are stored for later use. By keeping these data sets they may be used for other purposes e.g. as quality indicators.

Certain embodiments of the invention will now be described, by way of example only, with reference to the accompanying drawings in which.

Figure 1:
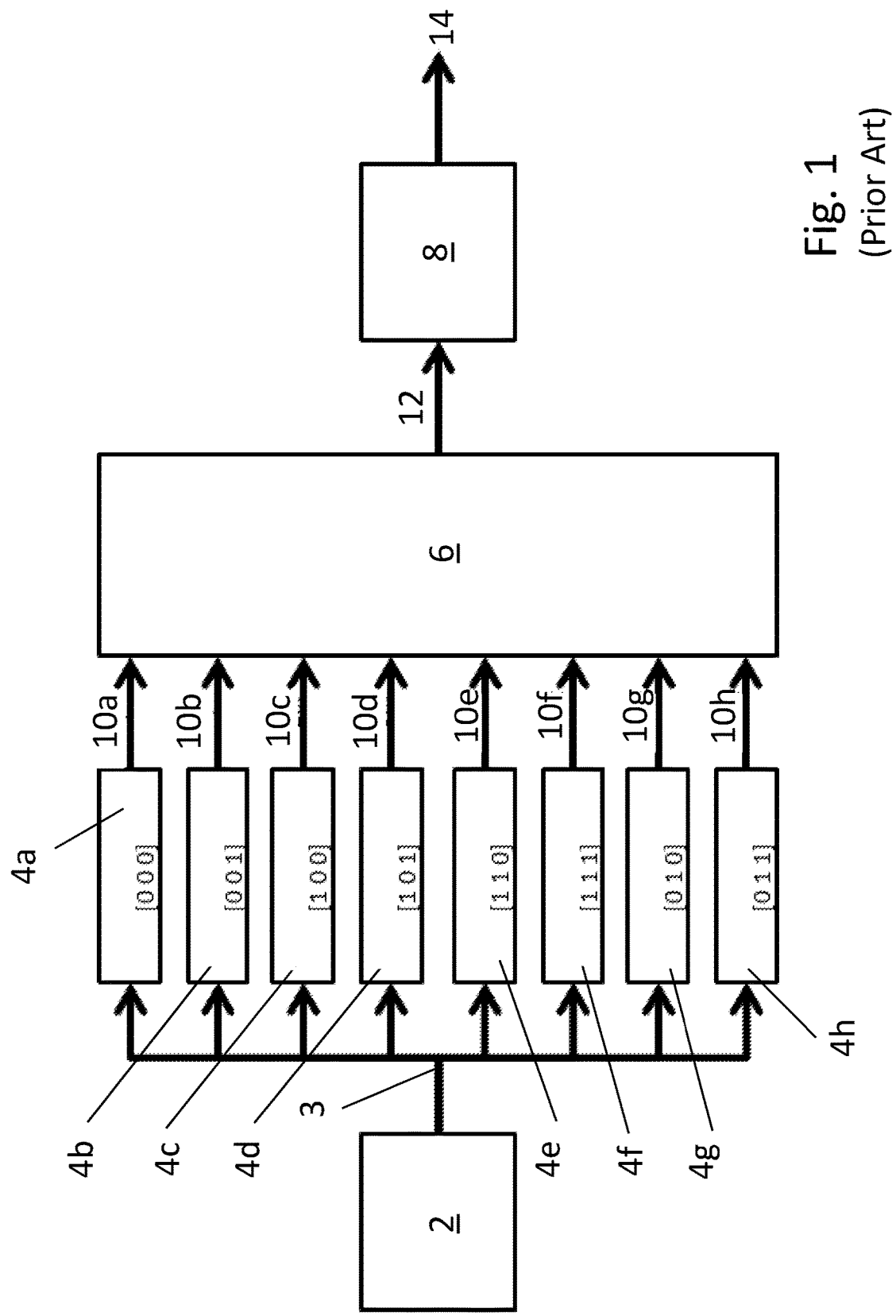
FIG. 1 shows schematically part of a prior art digital radio receiver arranged to generate a hard output bit.

FIG. 1 shows schematically part of an exemplary prior art receiver, described for reference purposes only, arranged to generate a hard output bit 14. In this arrangement, in-phase (I) and quadrature (Q) bitstream signals from a previous stage such as an amplifier or a filter (not shown) are stored in a shift register 2. In this arrangement, the shift register 2 has a width of three bits, i.e. it stores a current bit from the received bitstream and the two previous most recent bits from the received bitstream.

The shift register 2 produces a shift register output 3 of the three bits that it currently has stored. The shift register output 3 is passed to a set of eight correlators 4a-h corresponding to the eight different possible values that the three bit shift register output 3 may take. Each of the correlators 4a-h is arranged to convolve the shift register output 3 with a different bit sequence as indicated in order to produce a respective correlator match coefficient 10a-h.

Each of the correlator match coefficients 10-h produced has a numerical value for a given value of the shift register output 3, which is updated on every clock cycle when the shift register performs a logic shift operation to provide a new output 3 which includes the next new bit and discards the oldest one.

The correlator match coefficients 10a-h are provided to a decision block 6 which produces an observation output 12 that identifies which of the correlators 4a-h produced the strongest (i.e. the highest value) correlator match coefficient 10a-h. The 'winning' correlator therefore provides, through its associated sequence, an estimate of the three bits observed, Since the shift register 2 is three bits wide, any given incoming bit from the bitstream is "observed" three times, once in each position (left, middle, right) in the sequence. There are therefore three observation outputs 12 that have information about a given received bit. A voting block 8 determines from these three observations the value (i.e. digital 0 or 1) that each bit was seen to have at each observation as it traversed through this three bit "sliding window" (i.e. in the leftmost, central, and rightmost bit positions). The voting block 8 then produces a 'hard' decision output 14 that takes the definite value of either 0 or 1 for each received bit, depending on the digital value that was assigned to the bit most often (i.e. twice or all three times).

Figure 2:
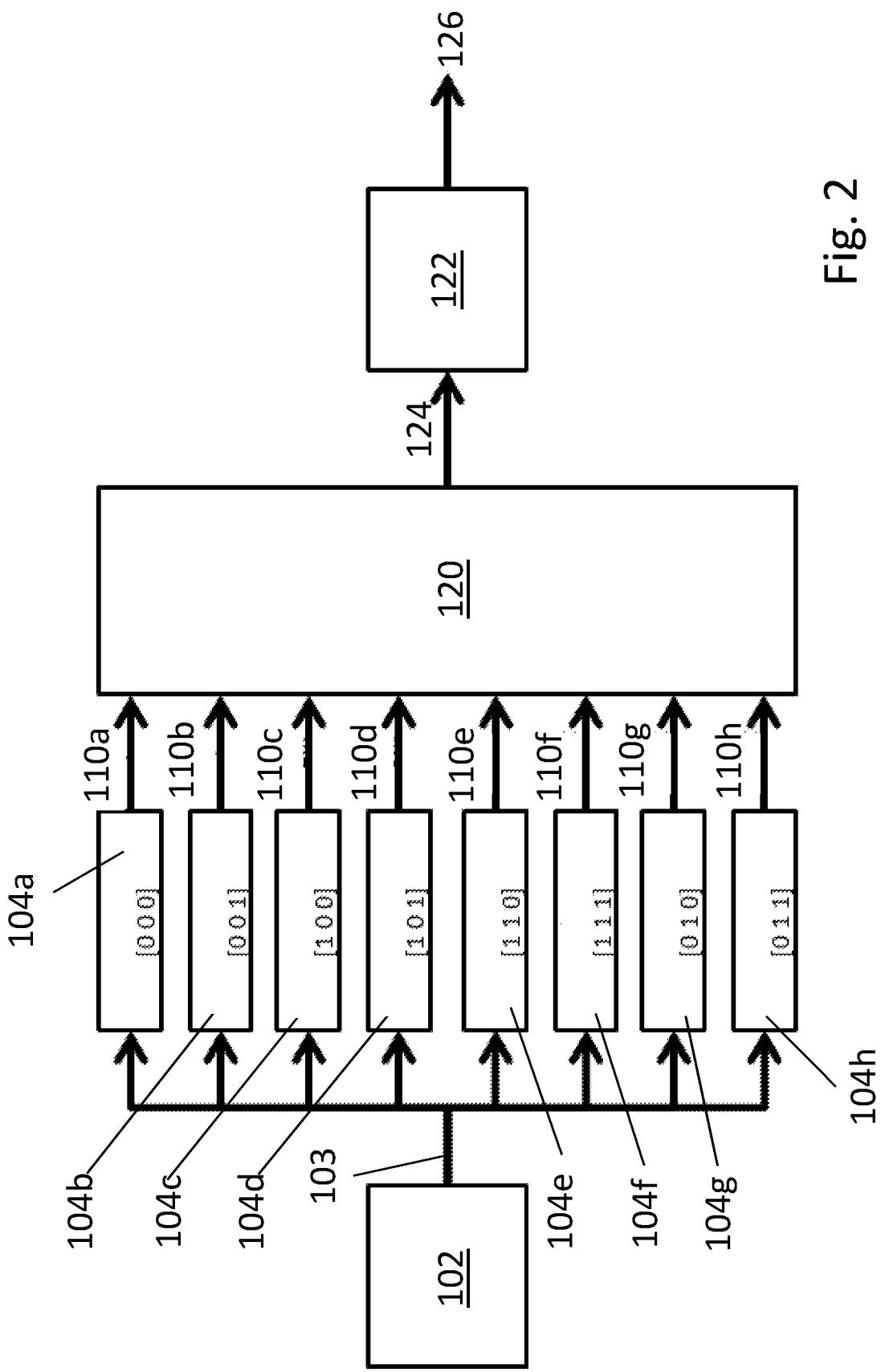
FIG. 2 shows schematically part of a digital radio a receiver arranged to generate a soft output bit in accordance with an embodiment of the present invention.

By contrast FIG. 2 shows part of a digital receiver arranged to generate a soft output bit in accordance with an embodiment of the present invention. In common with the arrangement described with reference to FIG. 1, in-phase and quadrature bitstream signals from a previous stage such as an amplifier or a filter (not shown) are stored in a shift register 102. It will be appreciated of course that the incoming bitstream is not necessarily quadrature modulated and thus the invention is by no means limited to working with I and Q signals.

The shift register 102 has a width of three bits as before, however it will be appreciated that the principles of the invention described herein apply to shift registers of any width greater than or equal to two. In order to accommodate wider shift registers (and thus more samples of the incoming bitstream), more correlators would of course be needed, i.e. for an n-bit wide shift register, $2^n$ correlators will be needed if all possible bit combinations are to be covered.

As previously described, a set of eight correlators 104a-h produce correlator match coefficients 110a-h that correspond to how well the shift register output 103 at each clock cycle matches the bit sequence assigned to the correlator. However, rather than being subsequently processed by a decision block which simply provides the best match, the correlator match coefficients 110a-h are passed to an evaluation block 120 described below.

The evaluation block 120 is arranged to produce a likelihood metric 124 as an output based on the correlator match coefficients 110a-h. In the present case of a three bit sliding window (i.e. the shift register is three bits wide meaning there are eight correlators), the likelihood metric 124 corresponding to the $k^{th}$ received bit comprises a 3×1 matrix as per Equation 1 below:

Equation 1: Likelihood metric 124

$$\begin{bmatrix} S_{0,k} \\ S_{1,k} \\ S_{2,k} \end{bmatrix} = \begin{bmatrix} m_{1,0} - m_{0,0} \\ m_{1,1} - m_{0,1} \\ m_{1,2} - m_{0,2} \end{bmatrix}$$

wherein:
$m_{1,0}$=MAX(110c, 110d, 110e, 110f)
$m_{0,0}$=MAX(110a, 110b, 110g, 110h)
$m_{1,1}$=MAX(110e, 110f, 110g, 110h)
$m_{1,3}$=MAX(110a, 110b, 100c, 110d)
$m_{1,2}$=MAX(110b, 110d, 110f, 110h)
$m_{0,2}$=MAX(110a, 110c, 110e, 110g)

Taking the first entry in the matrix, $m_{1,0}$ is the maximum correlator match score of those correlators that assign a value of 1 to the bit in the zeroth (i.e. leftmost) position in the sequence. These are: the correlator 104c corresponding to the sequence [1 0 0] having the match coefficient 110c; the correlator 104d corresponding to the sequence [1 0 1] having the match coefficient 110d; the correlator 104e corresponding to the sequence [1 1 0] having the match coefficient 110e; and the correlator 104f corresponding to the sequence [1 1 1] having the match coefficient 110f.

Similarly $m_{0,0}$ is the maximum correlator match score of the other correlators, which assign a value of 0 to the bit in the same (zeroth or leftmost) position in the sequence. These are: the correlator 104a corresponding to the sequence [0 0 0] having the match coefficient 110a; the correlator 104b corresponding to the sequence [0 0 1] having the match coefficient 210b; the correlator 104g corresponding to the sequence [0 1 0] having the match coefficient 110g; and the correlator 104h corresponding to the sequence [0 1 1] having the match coefficient 110h.

The first entry in the matrix is the difference between these two maximum correlator match scores. The second entry in the matrix is derived from carrying out the same analysis for the next (middle) position in the sequence and the third entry in the matrix is derived from carrying out the same analysis for the final (rightmost) position in the sequence Thus it will be seen from Equation 1 above that the likelihood metric 124 is calculated from a difference in probabilities between the maximum correlator match scores 110a-h corresponding to a 1 and a 0 in each bit position within each element of the 3×1 matrix. These likelihood metric matrices 124 are generated and stored every clock cycle, and thus for every received bit within the bitstream, there are three stored likelihood metric matrices 124 that contain information regarding an observation of that particular bit.

The likelihood metric matrices 124 are fed to a summation block 122. The summation block 122 performs a summation operation on the stored matrices 124 to produce a soft output bit $b_k$ as per Equation 2 below, which is then provided as the output 126. This might be used for example in a Viterbi algorithm (such algorithms being well documented in the art per se) wherein the output 126 may be used as the branch metrics that are used by a Viterbi decoder when deciding what is the most likely bit sequence for a given set of observations.

Equation 2: Summation block 122

$$b_k = \text{SUM}(S_{0,k}, S_{1,k-1}, S_{2,k-2})$$

Thus it will be seen from Equation 2 that the output 126 corresponds to a sum of the likelihood values corresponding to the $k^{th}$ bit after it has been observed three times i.e. it is the sum of the likelihood metrics for when a given bit was in the leftmost, central, and rightmost positions during three subsequent observations. Thus the output 126 is a "soft" bit, i.e. it has a non-integer value rather than a "hard" 0 or 1 assigned to it. It should be appreciated that the term "sum" is not strictly limited to simply adding the likelihood values, and it may in some instances be useful to perform a weighted sum, average or other combination. For instance, the result of the sum may in this case be divided by a scaling constant to obtain a scaled likelihood value. For example, the scaling constant may be chosen to be three in order to provide a mean likelihood value which would be particularly useful in cases where each of the elements within the likelihood metric matrix 124 has a value between 0 and 1 (thus making the sum have a value between 0 and 3)—dividing by three thus ensures the soft output bit is within the range of possible bit values. However, there may be other reasons to scale the likelihood values—e.g. in order to meet saturation and quantisation constraints that may be imposed by the system when physically implemented.

Figure 3:
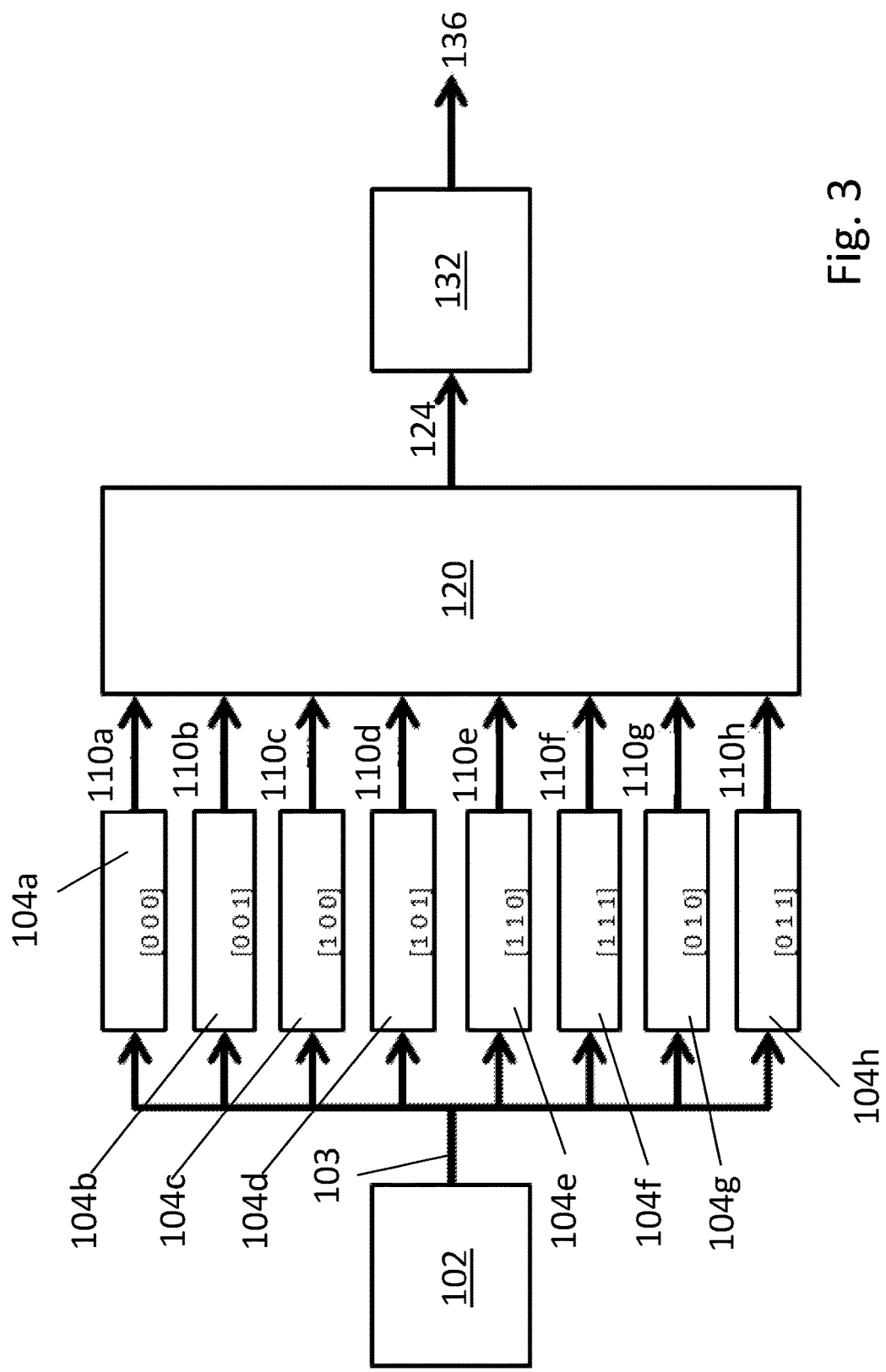
FIG. 3 shows another embodiment of the present invention.

FIG. 3 shows another embodiment of the present invention. In common with the previous embodiment described with reference to FIG. 2 above, there is provided a three bit shift register 102, eight correlators 104a-h, and an evaluation block 120 which operate in the same manner as described hereinbefore. However, in this embodiment, the likelihood matrix value 124 is provided as an input to a maximisation block 132. The maximisation block 132 operates to generate the soft output bit $b_k$ as per Equation 3 below.

$$b_k = \text{MAX}(S_{0,k}, S_{1,k-1}, S_{2,k-2}) \quad \text{Equation 3: Maximisation block 132}$$

Thus it will be seen from Equation 3 that the output 136 corresponds to the maximum of the likelihood values corresponding to the $k^{th}$ bit after it has been observed three times.

Figure 4:
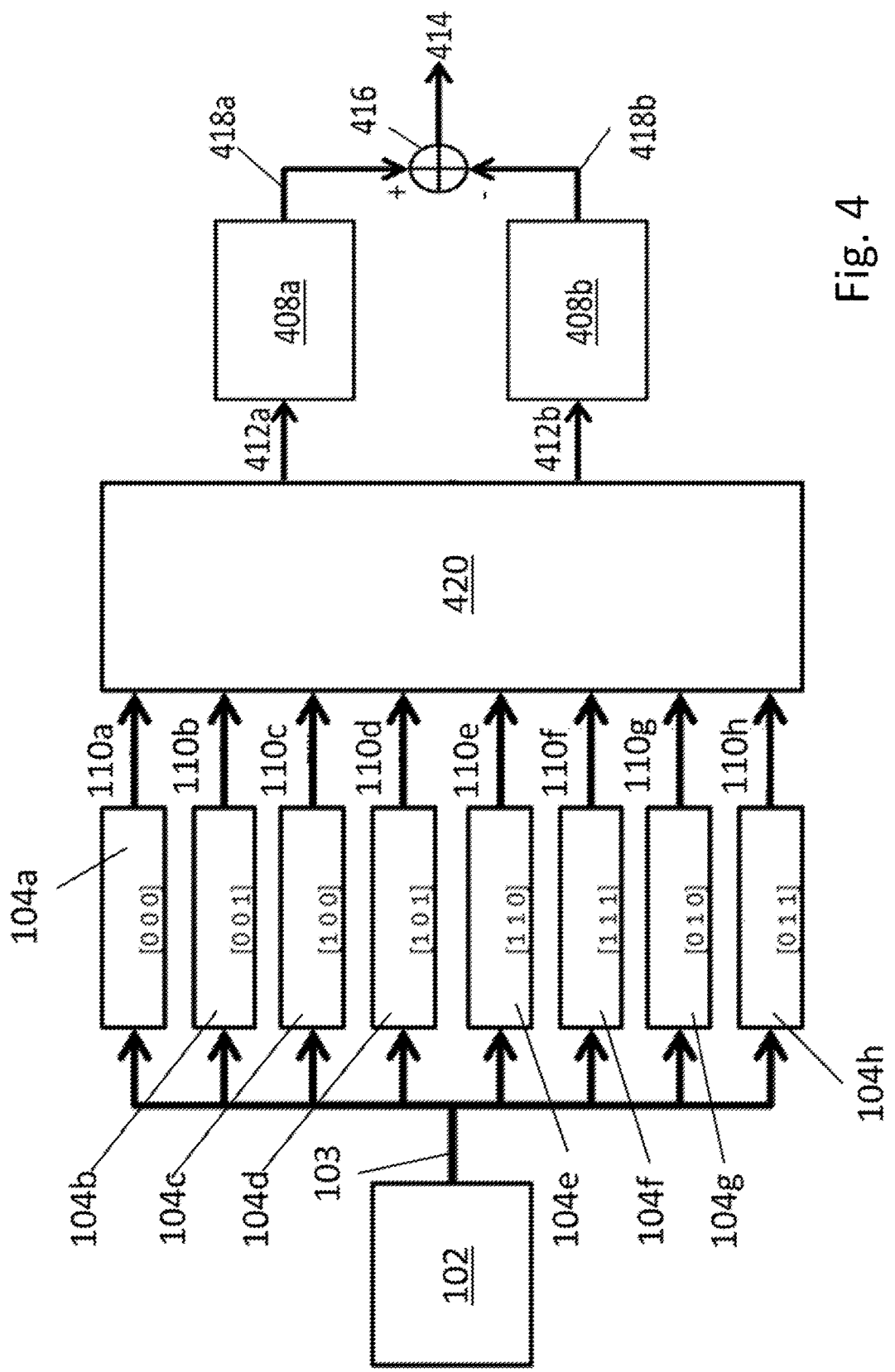
FIG. 4 shows a further embodiment of the present invention.

FIG. 4 shows a further embodiment of the present invention. In common with the previous embodiments described with reference to FIGS. 2 and 3 respectively, there is provided a three bit shift register 102 and eight correlators 104a-h which operate in the same manner as described hereinbefore.

However the evaluation block 420 of this embodiment is arranged to store two likelihood metric matrices 412a, 412b as per Equations 4 and 5 below:

Equation 4: Likelihood metric 412a $$\begin{bmatrix} U_{0,k} \\ U_{1,k} \\ U_{2,k} \end{bmatrix} = \begin{bmatrix} m_{1,0} \\ m_{1,1} \\ m_{1,2} \end{bmatrix}$$

Equation 5: Likelihood metric 412b $$\begin{bmatrix} V_{0,k} \\ V_{1,k} \\ V_{2,k} \end{bmatrix} = \begin{bmatrix} m_{0,0} \\ m_{0,1} \\ m_{0,2} \end{bmatrix}$$

wherein the values $m_{i,j}$ are defined in the same manner as described with reference to Equation 1.

The evaluation block 420 of this arrangement retains separate likelihood metric matrices 412a, 412b containing the correlator match score 110a-h of the correlators 104a-h that produce the highest correlator match score for a 1 or 0 in each bit position respectively. Each of these likelihood metric matrices 412a, 412b are then passed through separate maximisation blocks 408a, 408b which produce maximum high and maximum low metrics 418a, 418b as per Equations 6 and 7.

Equation 6: Maximum high metric 418a ($b_{k,upper}$) produced by maximisation block 408a $$b_{k,upper} = \text{MAX}(U_{0,k}, U_{1,k-1}, U_{2,k-2})$$

Equation 7: Maximum low metric 418b ($b_{k,lower}$) produced by maximisation block 408b $$b_{k,lower} = \text{MAX}(V_{0,k}, V_{1,k-1}, V_{2,k-2})$$

The resulting maximum high and low metrics 418a, 418b are then passed to a subtractor 416 that computes the difference between these metrics i.e. the difference between the metrics corresponding to the $k^{th}$ bit being a 1 and a 0 respectively, so as to generate a soft output bit $b_k$ 414.

Thus it will be seen that an improved method of and apparatus for determining a value of a bit within an input signal and that provides a soft bit output suitable for use with e.g. a Viterbi decoder has been described herein. Although particular embodiments have been described in detail, it will be appreciated by those skilled in the art that many variations and modifications are possible using the principles of the invention set out herein.

The invention claimed is:

1. A method comprising:
   receiving a digitally encoded radio signal comprising a bit to be determined;
   correlating a first bit sequence comprising the bit with a plurality of predetermined filters to create a first set of filter coefficients;
   calculating a first likelihood data set comprising a likelihood of said bit having a given value for each bit position from the first set of filter coefficients;
   correlating a second bit sequence comprising the bit with the plurality of predetermined filters to create a second set of filter coefficients;
   calculating a second likelihood data set comprising a likelihood of said bit having a given value for each bit position from the second set of filter coefficients; and
   calculating a soft output bit comprising a probability weighted bit value from data corresponding to the bit at a first bit position from the first likelihood data set and the bit at a second bit position from the second likelihood data set, wherein said first and second bit positions are different.

2. The method as claimed in claim 1, further comprising using a decoder to determine a value for the bit using the soft output bit.

3. The method as claimed in claim 1, further comprising:
   correlating an additional bit sequence comprising the bit with the plurality of predetermined filters to create an additional set of filter coefficients;
   calculating an additional likelihood data set comprising a likelihood of said bit having a given value for each bit position from the additional set of filter coefficients; and
   calculating the soft output bit from data corresponding to the bit at the first bit position from the first likelihood data set, the bit at the second bit position from the second likelihood data set, and the bit at an additional bit position from the additional likelihood data set wherein each of said bit positions is different.

4. The method as claimed in claim 1, wherein said bit sequences comprise a plurality of bits.

5. The method as claimed in claim 4, comprising carrying out correlations with each of the predetermined filters for bit sequences corresponding to the bit being at each possible position in the sequences.

6. The method as claimed in claim 1, comprising calculating the soft output bit by summing data corresponding to said first, second and optionally additional, bit positions.

7. The method as claimed in claim 1, comprising calculating the soft output bit by taking a maximum of data corresponding to said first, second and optionally additional, bit positions.

8. The method as claimed in claim 1, wherein the predetermined filters comprise each possible bit sequence.

9. The method as claimed in claim 1, comprising storing the maximum likelihood data sets for later use.

10. A digital radio receiver arranged to receive a digitally encoded radio signal comprising a bit to be determined, said digital radio receiver being arranged to perform a method, comprising:
    correlating a first bit sequence comprising the bit with a plurality of predetermined filters to create a first set of filter coefficients;
    calculating a first likelihood data set comprising a likelihood of said bit having a given value for each bit position from the first set of filter coefficients;

correlating a second bit sequence comprising the bit with the plurality of predetermined filters to create a second set of filter coefficients;

calculating a second likelihood data set comprising a likelihood of said bit having a given value for each bit position from the second set of filter coefficients; and calculating a soft output bit comprising a probability weighted value from data corresponding to the bit at a first bit position from the first likelihood data set and the bit at a second bit position from the second likelihood data set wherein said first and second bit positions are different.

11. The digital radio receiver as claimed in claim 10, further comprising a decoder arranged to determine a value for the bit using the soft output bit.

12. The digital radio receiver as claimed in claim 10, wherein the digital radio receiver is further arranged to:

correlate an additional one or more bit sequence(s) comprising the bit with a plurality of predetermined filters to create an additional one or more set(s) of filter coefficients;

calculate an additional one or more likelihood data set(s) comprising a likelihood for each bit position from the additional one or more set(s) of filter coefficients; and calculate a soft output bit from data corresponding to the bit at a first bit position from the first likelihood data set, the bit at a second bit position from the second likelihood data set, and the bit at an additional bit position from the additional one or more likelihood data set(s) wherein each of said bit positions is different.

13. The digital radio receiver as claimed in claim 10, wherein said bit sequences comprise a plurality of bits.

14. The digital radio receiver as claimed in claim 13, arranged to carry out correlations with each of the predetermined filters bit sequences corresponding to the bit being at each possible position in the sequences.

15. The digital radio receiver as claimed in claim 10, arranged to calculate the soft output bit by summing data corresponding to said first, second and optionally additional, bit positions.

16. The digital radio receiver as claimed in claim 10, arranged to calculate the soft output bit by taking a maximum of data corresponding to said first, second and optionally additional, bit positions.

17. The digital radio receiver as claimed in claim 10, wherein the predetermined filters comprise each possible bit sequence.

18. The digital radio receiver as claimed in claim 10, arranged to store the maximum likelihood data sets for later use.

* * * * *